(12) United States Patent
Vaughan

(10) Patent No.: US 8,217,653 B2
(45) Date of Patent: Jul. 10, 2012

(54) MULTI-CHANNEL RF COIL SYSTEM WITH MULTI-CHANNEL RF COIL TRANSCEIVER DETECTING MORE THAN ONE FREQUENCY AT THE SAME TIME FOR MAGNETIC RESONANCE IMAGING SYSTEMS AND METHODS

(75) Inventor: J. Thomas Vaughan, Stillwater, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 249 days.

(21) Appl. No.: 12/390,193

(22) Filed: Feb. 20, 2009

(65) Prior Publication Data

US 2009/0237077 A1    Sep. 24, 2009

Related U.S. Application Data

(60) Provisional application No. 61/066,503, filed on Feb. 21, 2008.

(51) Int. Cl.
*G01V 3/00* (2006.01)
*A61B 5/05* (2006.01)

(52) U.S. Cl. ........ 324/313; 324/309; 324/307; 324/318; 600/410; 600/422

(58) Field of Classification Search .......... 324/300–322; 382/128–131; 600/407–435
See application file for complete search history.

(56) References Cited

U.S. PATENT DOCUMENTS

| 3,350,633 | A | * | 10/1967 | Hyde | 324/316 |
|---|---|---|---|---|---|
| 3,358,222 | A | * | 12/1967 | Hyde | 324/300 |
| 3,388,322 | A | * | 6/1968 | Anderson et al. | 324/308 |
| 3,435,333 | A | * | 3/1969 | Gallo et al. | 324/313 |
| 3,437,914 | A | * | 4/1969 | Lantz et al. | 324/303 |
| 3,495,162 | A | * | 2/1970 | Nelson | 324/310 |
| 3,559,043 | A | * | 1/1971 | Hyde | 324/316 |
| 6,081,120 | A |   | 6/2000 | Shen | |
| 6,608,480 | B1 |   | 8/2003 | Weyers | |
| 7,659,719 | B2 | * | 2/2010 | Vaughan et al. | 324/318 |
| 7,800,368 | B2 | * | 9/2010 | Vaughan et al. | 324/318 |
| 2008/0024133 | A1 | * | 1/2008 | Vaughan et al. | 324/318 |
| 2008/0129298 | A1 | * | 6/2008 | Vaughan et al. | 324/322 |
| 2009/0237077 | A1 | * | 9/2009 | Vaughan | 324/307 |
| 2011/0095758 | A1 | * | 4/2011 | Walsh | 324/307 |
| 2011/0128000 | A1 | * | 6/2011 | Harvey | 324/307 |

FOREIGN PATENT DOCUMENTS

| EP | 0546622 A1 | 6/1993 |
|---|---|---|
| WO | 2006134557 A1 | 12/2006 |
| WO | 2007098011 A2 | 8/2007 |
| WO | 2007124246 A1 | 11/2007 |

* cited by examiner

*Primary Examiner* — Melissa Koval
*Assistant Examiner* — Tiffany Fetzner
(74) *Attorney, Agent, or Firm* — Seager, Tufte & Wickhem LLC

(57) ABSTRACT

An RF coil system for magnetic resonance applications includes a multi-channel RF coil transceiver and a multi-channel RF coil. The RF coil system is structured for reconfiguration between a plurality of operational modes.

22 Claims, 3 Drawing Sheets

MULTI-CHANNEL RF COIL SYSTEM WITH MULTI-CHANNEL RF COIL TRANSCEIVER DETECTING MORE THAN ONE FREQUENCY AT THE SAME TIME FOR MAGNETIC RESONANCE IMAGING SYSTEMS AND METHODS

RELATED APPLICATION

This application claims priority to U.S. Provisional Patent Application Ser. No. 61/066,503, filed Feb. 21, 2008, and entitled "RF COIL FOR IMAGING SYSTEMS AND METHODS OF OPERATION," J. Thomas Vaughan, which is hereby incorporated by reference.

GOVERNMENT RIGHTS The present subject matter was partially supported under NIH contract numbers EB000895-04 and EB006835. The United States government may have certain rights in the invention.

TECHNICAL FIELD

The present disclosure relates generally to radio frequency (RF) coils for RF field generation and detection, and more particularly, to RF coils used for magnetic resonance imaging.

BACKGROUND

Nuclear magnetic resonance (NMR) or magnetic resonance imaging (MRI), functional MRI (fMRI), electron spin resonance (ESR) or electron paramagnetic resonance (EPR) and other imaging techniques using RF field generating coils are finding increasing utility in applications involving imaging of various parts of the human body, of other organisms, whether living or dead, and of other materials or objects requiring imaging or spectroscopy. There is an ongoing need for new and improved RF coils and/or methods of operating RF coils.

SUMMARY

The present disclosure relates generally to radio frequency (RF) coils for RF field generation and detection, and more particularly, to RF coils used for magnetic resonance imaging.

In one aspect, the present disclosure provides an RF coil system for magnetic resonance applications. The RF coil system includes a multi-channel RF coil transceiver and a multi-channel RF coil. The RF coil system is structured for reconfiguration between a plurality of operational modes.

In another aspect, the present disclosure provides a magnetic resonance imaging system that includes a superconducting magnet, a gradient coil system, and an RF coil system. The RF coil system includes a multi-channel RF transceiver and a multi-channel RF coil. The RF coil system is structured for reconfiguration between a plurality of operational modes.

In yet another aspect, the present disclosure provides a method for magnetic resonance imaging. The method includes providing a magnetic resonance imaging apparatus including an RF coil system, positioning a patient in the magnetic resonance imaging apparatus, imaging the patient with the RF coil system in a first operational mode, and imaging the patient with the RF coil system in a second operational mode. In this method, the patient remains positioned in the magnetic resonance imaging apparatus during and between imagings in the first and second operational modes.

The above summary is not intended to describe each and every disclosed embodiment or every implementation of the disclosure. The Description that follows more particularly exemplifies the various illustrative embodiments.

BRIEF DESCRIPTION OF THE FIGURES

The following description should be read with reference to the drawings. The drawings, which are not necessarily to scale, depict selected embodiments and are not intended to limit the scope of the disclosure. The disclosure may be more completely understood in consideration of the following detailed description of various embodiments in connection with the accompanying drawings, in which.

DESCRIPTION

The following description should be read with reference to the drawings. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

Magnetic resonance imaging and a variety of other imaging techniques employ RF coils. The mechanical and electrical configuration, or mode, of an RF coil, along with the manner in which it is used, may generally affect the imaging capabilities of the imaging system of which the coil is a component. One RF coil mode may be suited for a whole body survey, for example, while another RF coil mode may allow higher quality imaging of a targeted body organ, which may have been identified as a target of interest in a prior survey. Yet another RF coil mode may be suited for spectroscopy of a portion of a targeted body organ, to detect, for example, metabolic products or signatures. In general, for a given imaging task, there may be an RF coil mode that is more suited for the imaging task than alternative RF coil modes. Furthermore, for treatment, diagnosis, or investigation of a subject, such as a medical patient, it may be desirable to image the subject with a number of different coil modes during a single session. Previously, switching RF coils has often been a time-consuming and laborious process, which has generally prevented single-session imaging with multiple coil modes. The present disclosure provides improvements to the ease and speed with which RF coil modes can be switched.

Figure 1:
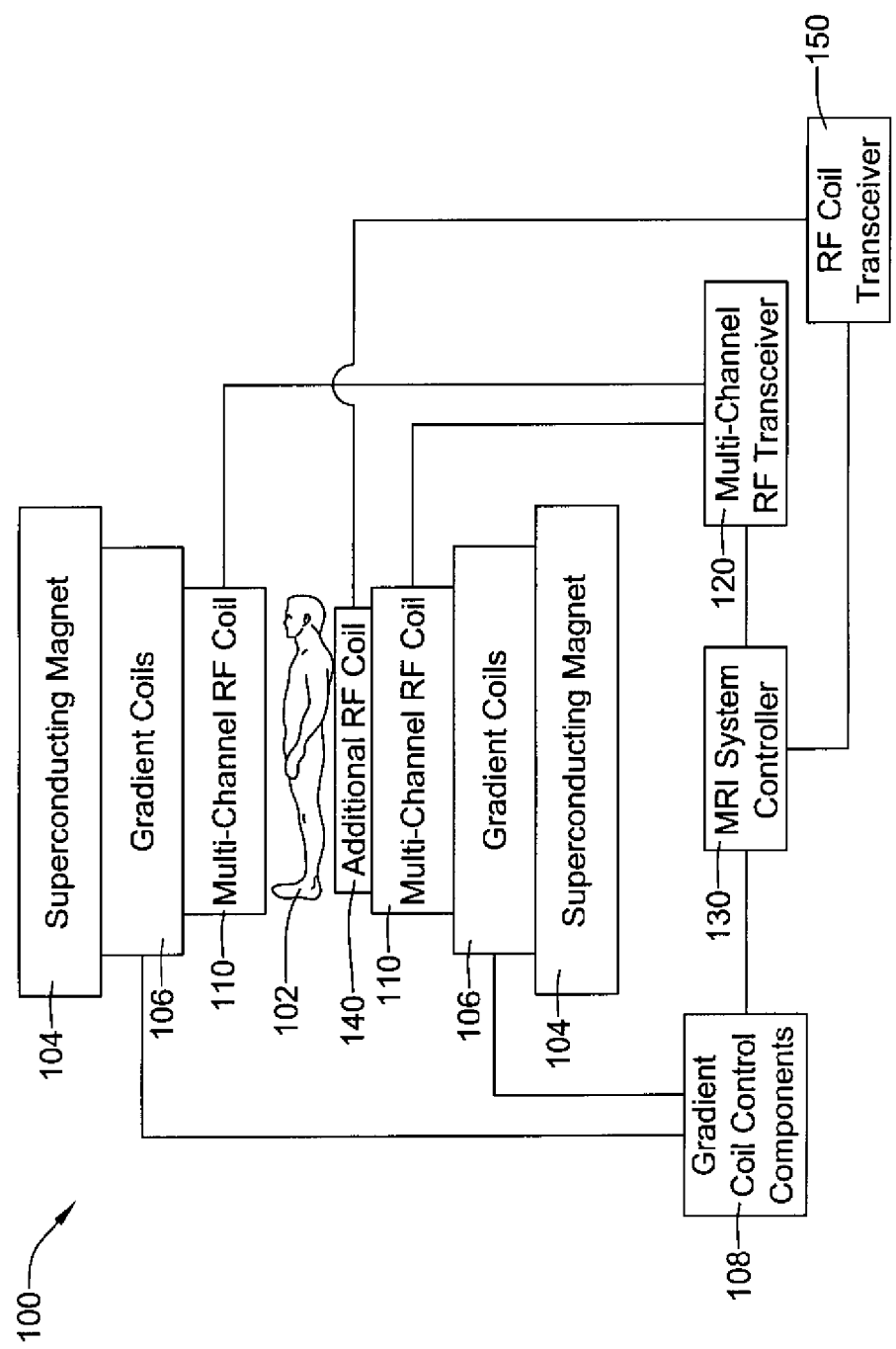
FIG. 1 is a schematic diagram of an illustrative magnetic resonance imaging system.

FIG. 1 is a schematic diagram of an illustrative magnetic resonance imaging system 100 in accordance with the present disclosure. MRI system 100 may be used to image a subject or patient 102. MRI system 100 includes a superconducting magnet 104 and gradient coils 106 that are coupled to gradient coil control components 108. The system 100 also includes an RF coil system that includes a multi-channel RF coil 110 connected to a multi-channel RF transceiver 120. The RF coil system may be switched between operational modes as described further herein. Gradient control components 108 and multi-channel RF transceiver 120 are connected to MRI system controller 130. MRI system 100 may include other components, such as an additional RF coil 140, which may be any suitable RF coil, including a multi-channel RF coil. Additional RF coil 140 may be considered a part of the RF coil system that includes multi-channel RF coil 110 and multi-channel RF coil 120. Additional RF coil 140 may be connected to an RF coil transceiver 150, or it may be connected to multi-channel RF coil transceiver 120, or it may be connected to any other suitable driving and/or receiving component. The additional RF coil 140 may be a transmit and/or receive coil. Additional RF coils may be useful for particular anatomical imaging tasks, and may be spatially located proximate to targeted anatomical regions, such as a head, foot, pelvis, etc., of a patient. In some embodiments, any or all of gradient coils, RF coils, additional RF coils, shim coils, and any other suitable coils may be electrically and/or mechanically integrated.

Figure 2:
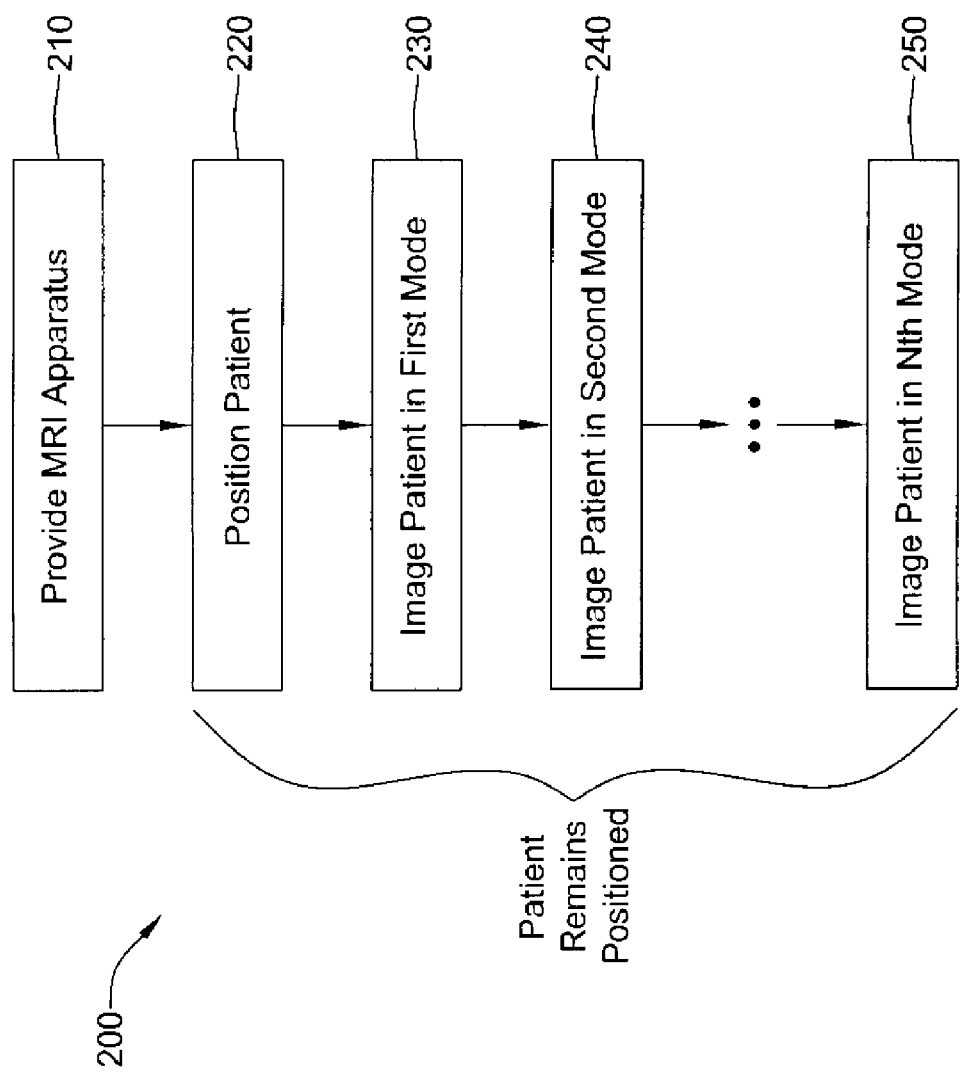
FIG. 2 is a flowchart showing an illustrative method for magnetic resonance imaging.

FIG. 2 is a flowchart showing an illustrative method 200 for magnetic resonance imaging in accordance with the present disclosure. An MRI apparatus, including an RF coil system, is provided as shown at block 210. A patient is positioned in the MRI apparatus at block 220. At block 230, the patient is imaged, with the RF coil system in a first operational mode. At block 240, the patient is imaged, with the RF coil system in a second operational mode. Further imagings in further operational modes may be performed, up to an imaging in an Nth operational mode as indicated at block 250. All imagings 230, 240, and 250 are performed during the same MRI session, with the patient remaining positioned in the MRI apparatus during and between the imagings.

Figure 3:
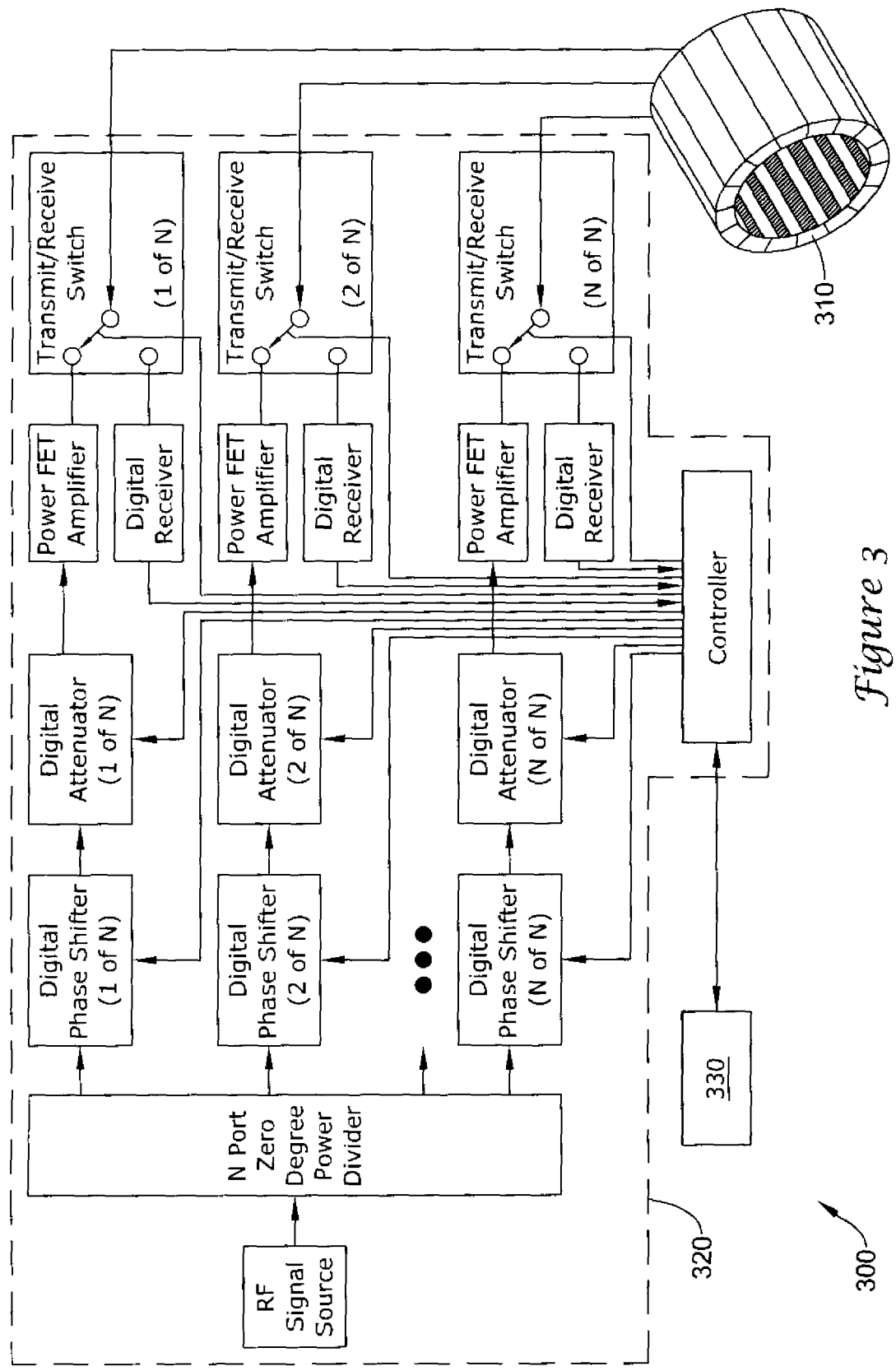
FIG. 3 is a schematic diagram of an illustrative RF coil system.

FIG. 3 is a schematic diagram of an illustrative RF coil system 300 that may be switched between operating or operational modes in accordance with the present disclosure. RF coil system 300 may be employed in an MRI system such as system 100 of FIG. 1, in which case it is employed as the coil 110 and transceiver 120 of that system. The RF coil system 300 includes a multi-channel RF coil 310 and a multi-channel RF coil transceiver 320. The multi-channel RF coil transceiver 320 may be connected to an MRI system controller 330. MRI system controller 330 may be coupled to multi-channel RF coil 310 through other mean as well. Either or both of transceiver 320 and coil 310 may have 1, 2, 4, 8, 16, 32, 64, or any other suitable number N of channels. The numbers of channels for the transceiver 320 and coil 310 may be the same, or it may be different. In some RF coil systems, there is a one-to-one correspondence between transceiver channels and coil channels, which may also be referred-to as coil elements. In some RF coil systems, the number of transceiver channels is less than the number of coil channels or elements.

RF coil transceiver 320 may be a transceiver as described in U.S. Pat. No. 6,969,992 ("PARALLEL TRANSCEIVER FOR NUCLEAR MAGNETIC RESONANCE SYSTEM," Vaughan et al.), which is hereby incorporated by reference, or it may be any other suitable RF transceiver. In some RF coil systems, more than one RF coil transceiver may be associated or connected with an RF coil. In some RF coil systems, an RF coil transceiver may be associated with more than one RF coil. RF coil transceivers may allow control of RF amplitude, frequency, phase, and timing for individual or multiple coil channels or elements. RF coil transceivers may be configured both for excitation of RF fields in RF coils, as well as reception of RF signals from RF coils. Selection between excitation (transmission) and reception modes may be made for individual channels, or collectively for sets of channels or for all channels.

RF coil 310 may be an RF coil as described in U.S. Pat. No. 6,633,161 ("RF COIL FOR IMAGING SYSTEM," Vaughan), which is hereby incorporated by reference, or it may be any other suitable RF coil. Suitable coils include, but are not limited to, coils having multi-channel arrays, including TEM coils including one or more independent transmission line elements, stripline arrays, microstrip arrays, transmission line arrays, and the like. In some cases, the coils may have independent phase and magnitude control. RF coil 310 may be a volume coil, generally defined as a coil with a plurality of current elements surrounding a volume containing an NMR active sample, or a surface coil, generally defined as a coil with one or more elements adjacent to an NMR active sample. RF coil 310 may be a coil structured appropriately for imaging of a particular external or internal anatomical region, such as the head, knee, elbow, breast, heart, etc., or it may be a body coil for imaging substantially an entire body or major subportion of a body. RF coil 310 may include one or more independent current elements, on which field generating currents may be controlled in magnitude, phase, frequency, space, and time.

RF coils systems as described herein may be useful for human head and body imaging at high magnetic field strengths, but are not necessarily limited to such high magnetic field strengths. RF coil systems of the present disclosure may be used in imaging systems employing magnetic field strengths of 1.5 T, 4 T, 4.1 T, 7 T, 8 T, 9.4 T, and any other suitable field strengths.

RF coil systems of the present disclosure may be operated in multiple operational modes and may be conveniently switched between the modes. A number of operational modes are described herein, however, it is contemplated that any other suitable operational modes may be used with RF coil system of the present disclosure. In general, operational modes may be transmit modes or receive modes. In the present disclosure, switching or reconfiguring modes does not include simply switching from a transmit mode to a receive mode, or vice versa, without any other change in mode configuration.

An RF coil system of the present disclosure may be operated in a single tuned, reactively coupled (driven) operational mode. A field generating and/or receiving current element of an RF coil is reactively coupled for RF signal transmit or receive operation when a current is inductively or capacitively excited in said element. A typical example of a reactively coupled RF coil will include a plurality of current elements containing one are more directly coupled elements which reactively excite (transmit to) or receive signal from one or more reactively coupled elements surrounding (volume) or adjacent to (surface) an NMR active sample. This mode may be a fixed quadrature mode, or it may be any other suitable mode.

An RF coil system of the present disclosure may be operated in a single tuned, directly coupled operational mode. A field generating and/or receiving current element of an RF coil is directly coupled for RF signal transmit or receive operation when a current is directly transmitted to or received from said element by means of a signal carrying conductor attached to said element. A typical example of a directly coupled RF surface coil or volume coil will include one or more directly coupled elements which excite (transmit to) or receive signal from an NMR active sample. This mode may be a fixed quadrature mode, or it may be any other suitable mode.

An RF coil system of the present disclosure may be operated in a dual tuned, reactively coupled operational mode. A typical example of this operational mode includes a surface or volume coil with one subset of one or more current elements tuned to one frequency, and another subset of one or more elements tuned to another frequency. At least some of the elements tuned to each frequency are reactively coupled to one or more directly coupled elements for each frequency.

An RF coil system of the present disclosure may be operated in a dual tuned, or double-tuned, directly coupled operational mode. A typical example of this operational mode includes a surface or volume coil with one subset of one or more current elements tuned to one frequency, and another subset of one or more elements tuned to another frequency.

In general, directly coupled operational modes may also be referred to as adjustable multi-channel modes, where a multi-channel RF transceiver allows adjustment to RF signals in multiple channels simultaneously in multiple degrees of freedom, including magnitude, frequency, phase, and timing of RF signal. Adjustable multi-channel modes may be single tuned, double tuned, or may involve greater than two RF frequencies.

An RF coil system of the present disclosure may be operated in a hybrid operational mode. A typical example of this operational mode includes a surface or volume coil with one subset of one or more elements reactively coupled, and another subset of one or more elements directly coupled. In this hybrid operational mode, one subset of reactively coupled elements may be tuned to one frequency, and another subset of directly coupled elements may be tuned to another frequency.

In an illustrative embodiment, a body coil may be built on a single form, with the ability to switch the mode of operation of the coil between a single tuned, reactively coupled operational mode, a single tuned, directly coupled operational mode, and a hybrid operational mode. In the single tuned, reactively coupled operational mode, the body coil has four symmetrically spaced, directly coupled elements which in turn are reactively coupled to the remaining elements of the coil. In this mode, the elements may be driven at one Larmor (proton) frequency, with equal magnitude, and with circularly polarized phasing. This circularly polarized, quadrature phased, body coil mode may replace, for example, conventional birdcage design body coils. This mode may be considered a fixed quadrature mode. In switching to the single tuned, directly coupled operational mode, all or a fraction of these elements could be switched to a direct drive configuration. Direct control over the currents in the independent coil elements, as made possible by a multi-channel RF coil transceiver (as described in, for example, U.S. Pat. No. 6,969,992), facilitates B1 field shimming, localization, scanning, transmit SENSE, frequency hopping, and other applications benefits. From this operational mode, a fraction of the coil current elements could be switched to a second frequency. In the hybrid operational mode, the coil configuration may use a first set of directly coupled (driven) current elements for MRI at the higher proton Larmor frequency where more B1 field control is required for optimal imaging, and a second set of reactively coupled current elements at a lower "X nuclei" Larmor frequency where a circularly polarized field would achieve good magnetic resonance spectroscopy (MRS) results.

RF coil systems of the present disclosure may be operated in any suitable operational modes. One operational mode is a double tuned mode including a first frequency in a fixed mode and an operational frequency in a multi-channel mode. Another operational mode is a multi-nuclear, multi-channel mode with at least one operational frequency driven in a multi-channel mode.

In an illustrative embodiment of the present disclosure, an RF coil system is switched between operational modes. The operational modes are distinguished from each other by differences in one or more of the following RF parameters: magnitude, frequency, phase, time, and space (i.e., location of coil elements, coils, or subcoils). Any permutation or combination of differences in these parameters may be included.

In exemplary embodiments of the present disclosure, multi-channel RF coil systems may be switched between any suitable combinations of operational modes. In one example, a multi-channel RF coil system may be switched from a fixed quadrature excitation mode, to an adjustable multi-channel excitation mode. In one example, a multi-channel RF coil system can be switched from a fixed quadrature excitation mode, to an adjustable multi-channel excitation mode. In one example, a multi-channel RF coil system can be switched from a fixed, single tuned quadrature mode to a fixed, double tuned quadrature mode of operation. In one example, a multi-channel RF coil system can be switched from a fixed, single tuned quadrature mode to a fixed, double tuned quadrature mode of operation. In one example, a multi-channel RF coil system can be switched from a fixed quadrature mode, to an adjustable multi-channel mode, to a double tuned mode with one frequency in fixed mode and one operational frequency driven in multi-channel mode for the coil. In one example, a multi-channel RF coil system can be switched from a fixed quadrature mode, to an adjustable multi-channel mode, to a double tuned mode with one frequency in fixed mode and one operational frequency driven in multi-channel mode for the coil. In one example, a multi-channel RF coil system can be switched from a fixed quadrature mode, to an adjustable multi-channel mode, to a multi-nuclear, multi-channel mode with operational frequency(s) driven in multi-channel mode for the coil. In one example, a multi-channel RF coil system can be switched from a fixed quadrature mode, to an adjustable multi-channel mode, to a multi-nuclear, multi-channel mode with operational frequency(s) driven in multi-channel mode for the coil.

In one example, the multi-channel RF coil system includes a body coil that can be switched from "conventional" drive quadrature mode, to multi-channel mode, to "hybrid" multi-nuclear mode. In one example, the multi-channel RF coil system includes a TEM body coil that can be switched from "conventional" drive quadrature mode, to multi-channel mode, to "hybrid" multi-nuclear mode. In one example, the multi-channel RF coil system includes a body coil that can be switched from "conventional" drive quadrature mode, to multi-channel mode, to multi-channel, multi-nuclear mode. In one example, the multi-channel RF coil system includes a TEM body coil that can be switched from "conventional" four port drive quadrature mode, to multi-channel mode, to multi-channel, multi-nuclear mode. In one example, the multi-channel RF coil system includes a body coil that can be switched from "conventional" drive quadrature mode, to multi-channel mode. In one example, the multi-channel RF coil system includes a TEM coil that can be switched from "conventional" drive quadrature mode, to multi-channel mode. Any other suitable combination of operational modes described herein may be employed in RF coil systems of the present disclosure.

In exemplary embodiments of the present disclosure, any suitable combinations of operational modes may be achieved in single form factor RE coils. Such RF coils may be volume or surface coils, and they may be body coils or coils intended for imaging body parts such as the head.

RF coil current elements are described in this disclosure as being "reactively coupled" or "directly coupled." The coupling of a "directly coupled" current element may include reactive components between the current element and the RE transceiver, generally for the purpose of impedance matching, and thus the "directly coupled" current element may be, strictly speaking, reactively coupled to the RF transceiver and it may be driven reactively. For the purposes of this disclosure, however, one of skill in the art will recognize that a "reactively coupled" current element of an RF coil is a current element that is coupled to an other current element of the RF coil through inductance and capacitance, where the other current element of the RF coil is a current element capable of transmitting and/or receiving significant RF radiation to or from an NMR active sample, and which is designed to effect such transmission and/or reception. A "reactively coupled" current element communicates electrically with an RF transceiver through such an other current element and does not significantly communicate electrically with an RF transceiver without the intervening other current element.

Some exemplary RF coils of the present disclosure include reactively decoupled coil elements. Some exemplary RF coils of the present disclosure include reactively coupled coil elements. In such coils with reactively coupled coil elements, reactive coupling between some or all coil elements may be suppressed. Suppression of reactive coupling may be achieved by any suitable method, including those described in U.S. Pat. No. 6,633,161. Some exemplary coils may achieve suppression of reactive coupling with lumped element bridging or without lumped element bridging. Suppression of reactive coupling may also be achieved with distributed reactance cancellation, as described in, for example, U.S. Pat. No. 6,633,161.

Switching or reconfiguring between operational modes of a multi-channel RF coil system may be achieved through any suitable method and with any suitable means. In some cases, switching modes may be achieved substantially or entirely by configuration of the multi-channel RF transceiver associated with the multi-channel RF coil of a multi-channel RF coil system. In some cases, such configuration may be commanded or coordinated by or from an MRI system controller. In some cases, switching modes may include directly and/or reactively coupling or decoupling coil elements of a multi-channel RF coil. Coupling and decoupling may be accomplished by orienting the spatial position of coil elements relative to each other, by manipulating the electrical phase relations of coil elements relative to each other, by changing the field amplitude of coil elements relative to each other, by changing the resonant frequency of coil elements relative to each other and/or by temporal separation of the field of coil elements relative to each other by any combination of the above techniques. Discrete, lumped, or distributed capacitance and/or inductance may be added, removed, coupled, or decoupled to any or all coil elements. Furthermore, mechanical means, including relative spatial manipulations of the coil elements or mechanical switching or reorienting of the phase, amplitude and/or frequency of coil elements, current, voltage and RF fields might be utilized to effect coupling and/or decoupling of coil elements. Electrical or electronic control of coupling or decoupling may be by PIN diodes, solid state switches such as transistors, and semiconductor relays, tube switches, electromechanical relays, varistors, and the like. In addition to the "active" electronic components indicated above, "passive" components may also be used, including small signal diodes, limiter diodes, rectifier diodes, etc., these components often being used together with quarter-wave circuits. Switching operational modes of an RF coil system may involve any appropriate combination of configuration of the multi-channel RF transceiver and electrical, electronic, electromechanical, mechanical, or any other modification to the configuration of the multi-channel RF coils. In some embodiments, all steps in switching operational modes of an RF coil system may be commanded and/or controlled by the MRI system controller of the MRI system.

Hardware configurations that may be used in the practice of the present disclosure are described herein.

Hardware has been developed for 7T equipment. The MRI system may be a Magnex 7T, 90 cm bore magnet with Siemens whole body gradients and shims (i.d.=63 cm). A Siemens 7T console may be used, together with a custom 16 kW, 16 channel, solid state transmitter from Communications Power Corporation (CPC). An actively detuned, 300 MHz. RF body coil was built together with its PIN detuning circuits and system control interface. Specialty 300 MHz receive circuits, such as a 6-element stripline dual breast array, were developed together with the necessary PIN decoupling circuits and multi-channel, digital receivers.

A custom 16 kW, 16 channel, solid state transmitter from Communications Power Corporation (CPC) may be employed in multiple configurations. In one mode, 16 channels may be used over a frequency range from 30-405 MHz with 1 kW available per channel. This mode may be employed, for example, for proton frequency imaging of targeted organs. In another mode, two channels may be used over a frequency range from 30-405 MHz with 6 or 7 kW available per channel, depending on gain linearity requirements. This mode may be employed, for example, for two nucleus imaging. In yet another mode, one channel may be used over a frequency range from 30-405 MHz with 10.5 or 11.5 kW available per channel, depending on gain linearity requirements. This mode may be employed, for example, for circularly-polarized global scouting imaging.

In some cases, an illustrative RF coil included an eight-channel, flexible, transceiver array built according to stripline transmission line (TEM) principles. This eight-channel coil included of a pair of four-element TEM arrays, one to be located anterior and the other posterior to the pericardium. Four coil elements each were attached in parallel configuration to a flexible PTFE plate measuring 22.7 cm×35.6 cm×0.3 cm thick. The individual coil elements were 15.3 cm long with a 1.27 cm wide inner conductor and a 5.0 cm wide outer conductor, separated by a 1.9 cm thick PTFE dielectric bar stock with a low loss tangent and a permittivity of 2.08. A 4.3 cm air gap separated each coil element.

In some cases, each element were individually tuned to 297 MHz (7T), and matched to a 50 ohm, coaxial TR signal line. Capacitive decoupling facilitated greater than 18 dB isolation between elements for the unloaded coil.

Imaging experiments were performed on a 7T ($\omega_o$=297.14 MHz) magnet (Magnex Scientific, UK) interfaced to a Siemens console and whole body gradients. The output of an 8 kW RF power amplifier (CPC, Brentwood, N.Y.) was divided into the eight channels of equal magnitude and phase to feed an eight element coil (Werlatone, Brewster, N.Y.). Eight high-power phase shifters, (ATM, Patchogue, N.Y.) and incremental cable lengths were used to adjust the transmit phase as required to accomplish $B_1$ shimming for optimal image homogeneity over the heart region. Power divider specifications included −0.4 dB insertion loss and 1° phase resolution, while the phase shifters measured −0.5 dB insertion loss over a phase range of 120°.

In some methods, local $B_1$ shimming was used. To optimize the RF field uniformity and RF transmit and receive efficiency for the heart, the transmitted "$B_1^+$" field components of the independent coil elements were adjusted or "shimmed" to effect an approximate phase coherence or "constructive interference" of the short RF wavelengths (12 cm) over the region of interest. To adjust the phase angle of the RF current and resultant $B_1$ field generated by each element, an excitation pulse was transmitted through one channel at a time while the other transmit channels were terminated with 50Ω loads. The feedback signal was received from all eight channels during this stepwise transmit field shimming process. The relative transmit $B_1^+$ phases were then calculated using a low resolution, low flip angle gradient echo (GRE) images (TR/TE=660 ms/4.10 ms; Matrix=192×122; FOV=40.0 cm×40.0 cm; slice thickness=0.5 cm).

In one example, the MRI system used for a study was built around a Magnex 7 T, 90 cm bore magnet (Magnex Scientific, Oxfordshire, UK) equipped with a Sonata gradient system (Siemens, Erlangen, Germany). Interfaced to this magnet was a Unity Inova spectrometer (Varian, Palo Alto, Calif.), together with a custom, 8 kW solid-state RF power amplifier (Communications Power Corporation (CPC), Hauppauge, N.Y.). The whole body images in this report were acquired with an actively detuneable 300 MHz transverse electromagnetic (TEM) body coil. Also developed was an eight channel TEM surface coil. For imaging the human trunk, these surface coils were used in pairs anterior and posterior to the body region of interest. The elements of these multi-channel, transmit and receive coils were driven independently from a new 16 channel, parallel transceiver designed in-house and built by CPC. This system enabled $B_1$ phase and magnitude control of each of the coil's 16 independent elements to facilitate $B_1$ shimming and parallel imaging methods. A circularly-polarized, unilateral RF breast coil consisting of two shielded crossed loops was also built and tested.

In another example, body imaging with Multi-channel TEM Surface Coil was performed. Employing multi-channel transceiver coils closely fitted to the body offered an alternative to whole body coils for imaging localized regions of interest. With this coil, a phase and gain controlled transmit signal was delivered to each independent element. In turn, signal was received from each element through a TR switch, and combined by sum-of squares or other image reconstruction algorithm. RF power was monitored for each channel.

In another example, breast imaging and spectroscopy with Quadrature Surface Coil was performed. MRI and MRS data were acquired from a healthy normal female volunteer using a transceiver surface coil. To distinguish fibro-glandular from adipose tissue, $T_1$-weighted images were acquired using fat-suppressed 3D FLASH. Acquisition parameters were: TR/TE=15/5 ms, FOV=14 cm, and matrix=256×256×64. Single-voxel spectra were collected using the LASER pulse sequence (20) and TE averaging. To quantify fibro-glandular choline containing compounds, the unsuppressed water signal in the voxel was used as an internal reference. LASER localization was used to achieve VOI=1.6 mL, TR=3 s, TE=43-195 ms in 128 increments, and 8 Hz line broadening.

Not all "body" imaging is best served with a body coil. Cardiac imaging and spectroscopy can gain greatly from the temporal, spatial, and spectral resolution inherent to 7T. Significant improvements in heart image SNR and $B_1$ uniformity were achieved by using a multi-channel transceiver, together with $B_1$ shimming. The local SAR required for these improved surface coil images was approximately the same 1 W/kg used to acquire the body images. Use of local, multi-channel, transceiver coils with $B_1$ shimming has proven successful in 7T prostate imaging as well.

For local imaging and spectroscopy of more superficial anatomy such as the breasts, more conventional transceiver surface coils can be used effectively. Early results from a 7 T breast cancer study gives example for the promise of 7 T diagnostics. Measurement of total choline-containing compounds (tCho) by localized $^1$H MRS offers a means to distinguish malignant from benign lesions and to predict response to neoadjuvant chemotherapy. The detection of tCho in small lesions having low cellularity is usually limited by insufficient SNR at clinical field strengths. Previous breast MRS studies at 4 T have reported higher SNR, enabling the detection of tCho in smaller lesions as well as the occasional detection of other metabolites such as taurine, creatine, and glycine. The ability to detect relatively narrow tCho and Taurine resonances in normal breasts provides motivation to pursue future 7 T studies of breast cancer.

First examples of theoretical models, technology and methods for investigating the feasibility of 7T body imaging have been developed and demonstrated. Technology developments include a 300 MHz body coil, a multi-channel surface coil, and a small, single channel surface coil. Preliminary imaging results demonstrate whole body imaging at 7T with a body coil, and with locally placed multi-channel transceiver coils and $B_1$ shimming. Models and measurements indicate that the conventional, uniform, circularly polarized body coil may have limitations for homogeneous excitation at 7T. Locally placed, multi-channel transceivers may provide a solution to body coil shortcomings at 7T. Improvements in both signal and homogeneity appear to be gained when using multi-channel transceiver coils with $B_1$ shimming for imaging local regions of interest. Local, single channel surface coils may also be useful, especially for superficial regions of interest. Cardiac and breast imaging and spectroscopy appear to be early applications worth pursing at 7T. With the proper selection of coils and methods such as $B_1$ shimming, body imaging in general may be feasible at 7T.

A new generation body coil platform could have a single RF body coil form built to accommodate three functional configurations, such as, for example, a single tuned, 32 element quadrature coil to be compatible with GE's current 3T and 7T system products, a sixteen channel transmit coil for B1 shimming, Parallel transmit (transmit SENSE) and other advanced functions, and a sixteen channel transmit body coil together with a sixteen element quadrature X nucleus coil such as 31P of great interest in cardiac imaging applications. All three of these coil options would be available in the same coil design and form factor, and could be pre-set in the factory, or activated in the field. In some cases, this coil would be combined with a gradient coil.

As used throughout this disclosure, the term quadrature excitation is defined as circular polarization of coil's RF magnetic field. TEM is defined as any electrical circuit capable of propagating a TEM wave, any transmission line, such as, for example, striplines, microstrip, coax lines, wave guides, cavities. Excitation is defined as transmit, drive, or driven. Double tuned, dual tuned, multi-nuclear, and multiple tuned describe a coil resonant or operational at more than one frequency. Single tuned describes a coil is resonant or operational at a single frequency. In a multi-channel coil, multiple coil elements are independently capable of being driven and/or receiving. In a fixed mode of operation, coil currents are not readily adjusted in coil after the coil's configuration. Coil currents are adjustable in independent elements of a multi-channel coil during the operation of the coil. Coupling refers to mutual reactance or mutual inductance or mutual capacitance between coil current elements. Lumped elements include discrete capacitors and/or inductors. Conventional drive is driving typically two or four elements (aka ports) of a "fixed" coil containing more than the number of driven elements. A typical example would be a 16 element, quadrature birdcage or TEM coil driven at four symmetrically spaced elements.

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

What is claimed is:

1. An RF coil system configured for magnetic resonance applications, comprising:
   a multi-channel RF coil transceiver configured to excite an RF field in an RF coil and/or receive RF signals from the RF coil; and
   a multi-channel RF coil connected to the multi-channel RF coil transceiver, the multi-channel RF coil configured for nuclear magnetic resonance (NMR) imaging, wherein:
   the RF coil system being structured for reconfiguration between a plurality of operational modes, wherein at least one of the plurality of operational modes is a frequency dual tuned, reactively coupled, multi-nuclear, multi-channel mode with at least one operational frequency driven in a multi-channel mode, wherein a first subset of one or more current elements of the multi-channel RF coil are tuned to a first frequency associated with a first nuclei, and a second subset of one or more elements of the multi-channel RF coil are tuned to a second frequency associated with a second nuclei, which allows magnetic resonance imaging to occur simultaneously over both the first and second frequency.

2. The RF coil system of claim 1, wherein the at least one of the plurality of operational modes is a quadrature mode.

3. The RF coil system of claim 1, wherein the at least one of the plurality of operational modes is an adjustable multi-channel mode.

4. The RF coil system of claim 1, wherein the at least one of the plurality of operational modes is a single tuned mode.

5. The RF coil system of claim 1, wherein the at least one of the plurality of operational modes is a double tuned mode.

6. The RF coil system of claim 5, wherein the double tuned mode includes a first frequency in a fixed mode and an operational frequency in a multi-channel mode.

7. The RF coil system of claim 1, wherein at least two of the plurality of operational modes differ from each other in at least one of the parameters selected from the group consisting of magnitude, frequency, phase, time, and space.

8. The RF coil system of claim 1, wherein the at least one of the plurality of operational modes is a transmit mode.

9. The RF coil system of claim 1, wherein the at least one of the plurality of operational modes is a receive mode.

10. The RF coil system of claim 1, wherein the RF coil comprises reactively coupled coil elements.

11. The RF coil system of claim 10, wherein reactive coupling between at least two coil elements is suppressed.

12. The RF coil system of claim 11, wherein the suppression of reactive coupling is achieved without lumped element bridging.

13. The RF coil system of claim 11, wherein the suppression of reactive coupling is achieved with distributed reactance cancellation.

14. The RF coil system of claim 1, wherein the RF coil comprises reactively decoupled coil elements.

15. The RF coil system of claim 1, wherein the RF coil is a body coil.

16. The RF coil system of claim 1, wherein the RF coil is a head coil.

17. The RF coil system of claim 1, wherein the RF coil is a TEM coil that includes one or more independent transmission line elements.

18. The RF coil system of claim 1, further comprising an additional RF coil.

19. The RF coil system of claim 18, further comprising a third coil, wherein the RF coil, the additional RF coil, and the third coil are electrically and mechanically integrated.

20. The RF coil system of claim 1, wherein the at least one of the plurality of operational modes is a fixed mode.

21. A method for magnetic resonance imaging, comprising:
   providing a magnetic resonance imaging apparatus including an RF coil system containing a multi-channel RF transceiver and a multi-channel RF coil;
   positioning a patient in the magnetic resonance imaging apparatus;
   imaging the patient with the RF coil system in a first operational mode; and
   imaging the patient with the RF coil system in a second operational mode;
   wherein the patient remains positioned in the magnetic resonance imaging apparatus during and between imaging's in the first and second operational modes; and
   further wherein at least one of the first operational mode and the second operational mode is a frequency dual tuned, reactively coupled, multi-nuclear, multi-channel mode with at least one operational frequency driven in a multi-channel mode, wherein a first subset of one or more current elements of the multi-channel RF coil are tuned to a first frequency associated with a first nuclei, and a second subset of one or more elements of the multi-channel RF coil are tuned to a second frequency associated with a second nuclei, which allows magnetic resonance imaging to occur simultaneously over both the first and second frequency.

22. A magnetic resonance imaging system, comprising
   a superconducting magnet;
   a gradient coil system; and
   an RF coil system comprising
      a multi-channel RF transceiver and
      a multi-channel RF coil,
      wherein the multi-channel RF transceiver is configured to excite an RF field in an RF coil and/or receive RF signals from the RF coil and the multi-channel RF coil is configured for nuclear magnetic resonance (NMR) imaging,
      wherein: the RF coil system is structured for reconfiguration between a plurality of operational modes,
      wherein at least one of the plurality of operational modes is a frequency dual tuned, reactively coupled, multi-nuclear, multi-channel mode with at least one operational frequency driven in a multi-channel mode, and wherein a first subset of one or more current elements of the multi-channel RF coil are tuned to a first frequency associated with a first nuclei, and a second subset of one or more elements of the multi-channel RF coil are tuned to a second frequency associated with a second nuclei, which allows magnetic resonance imaging to occur simultaneously over both the first and second frequency.

* * * * *

UNITED STATES PATENT AND TRADEMARK OFFICE
CERTIFICATE OF CORRECTION

PATENT NO. : 8,217,653 B2  Page 1 of 1
APPLICATION NO. : 12/390193
DATED : July 10, 2012
INVENTOR(S) : J. Thomas Vaughan It is certified that error appears in the above-identified patent and that said Letters Patent is hereby corrected as shown below:

In the Specifications:

In Column 1, Lines 16 to 21 delete the following:

"GOVERNMENT RIGHTS The present subject matter was partially supported under NIH contract numbers EB000895-04 and EB006835. The United States government may have certain rights in the invention."

and add the following:

--GOVERNMENT INTEREST

This invention was made with government support under EB000895-04 and EB006835 awarded by the National Institutes of Health. The government has certain rights in the invention.--

Signed and Sealed this
Twenty-third Day of April, 2013

Teresa Stanek Rea
*Acting Director of the United States Patent and Trademark Office*